(12) United States Patent
Kim et al.

(10) Patent No.: US 9,171,605 B1
(45) Date of Patent: Oct. 27, 2015

(54) CONCENTRATED ADDRESS DETECTING METHOD OF SEMICONDUCTOR DEVICE AND CONCENTRATED ADDRESS DETECTING CIRCUIT USING THE SAME

(71) Applicant: Samsung Electronics Co., Ltd., Suwon-si (KR)

(72) Inventors: Young-Sik Kim, Gunpo-si (KR); Won-Il Bae, Seongnam-si (KR); Myeong-O Kim, Suwon-si (KR); Min-Soo Kim, Seoul (KR); Ho-Seok Seol, Daegu (KR); Min-Sang Park, Yongin-si (KR); Kyo-Min Sohn, Yongin-si (KR); Chi-Hwan Lee, Daegu (KR); Sang-Joon Hwang, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/103,794

(22) Filed: Dec. 11, 2013

Related U.S. Application Data

(60) Provisional application No. 61/740,706, filed on Dec. 21, 2012.

(51) Int. Cl.
*G11C 11/408* (2006.01)
*G11C 11/406* (2006.01)

(52) U.S. Cl.
CPC ........ *G11C 11/40607* (2013.01); *G11C 11/408* (2013.01)

(58) Field of Classification Search
CPC ........ G11C 7/1006; G11C 7/14; G11C 7/062; G11C 7/22; G11C 11/406; G11C 11/4076; G11C 29/02; G11C 11/4074; G11C 8/18
See application file for complete search history.

(56) References Cited

U.S. PATENT DOCUMENTS

| 5,644,545 | A | 7/1997 | Fisch |
|---|---|---|---|
| 5,777,921 | A * | 7/1998 | Takata et al. .................. 365/145 |
| 8,009,498 | B2 | 8/2011 | Chang et al. |
| 2007/0033339 | A1 | 2/2007 | Best et al. |
| 2007/0070764 | A1* | 3/2007 | Miyamoto et al. ............ 365/222 |
| 2007/0183242 | A1 | 8/2007 | Miyamoto |
| 2008/0151669 | A1 | 6/2008 | Bill et al. |
| 2009/0161459 | A1 | 6/2009 | Kohler et al. |
| 2009/0190409 | A1 | 7/2009 | Dittrich et al. |
| 2011/0110175 | A1 | 5/2011 | Chang et al. |
| 2011/0122687 | A1 | 5/2011 | Kwon et al. |
| 2013/0097403 | A1 | 4/2013 | Zheng et al. |
| 2014/0095780 | A1 | 4/2014 | Bains et al. |

FOREIGN PATENT DOCUMENTS

JP 11-096755 4/1999
KR 10-0317195 5/2000

(Continued)

*Primary Examiner* — James G Norman
(74) *Attorney, Agent, or Firm* — Muir Patent Law, PLLC

(57) ABSTRACT

Provided is a method of detecting a concentrated address of a semiconductor device using an n-bit address. The method includes dividing the n-bit address into k groups, wherein each of n and k is an integer equal to or greater than 2, for each group of the k groups, detecting one or more concentrated sub addresses corresponding to the group, and generating at least one concentrated address by combining the one or more concentrated sub addresses for the k groups.

22 Claims, 15 Drawing Sheets

(56) References Cited

FOREIGN PATENT DOCUMENTS

| | | |
|---|---|---|
| KR | 10-2006-0054822 A | 5/2006 |
| KR | 10-2009-0129624 A | 12/2009 |
| KR | 10-2010-0076092 A | 7/2010 |
| KR | 10-2010-0124593 A | 11/2010 |
| KR | 10-2012-0059097 A | 6/2012 |
| KR | 10-1198251 | 7/2012 |
| KR | 10-2012-0131423 A | 12/2012 |

* cited by examiner

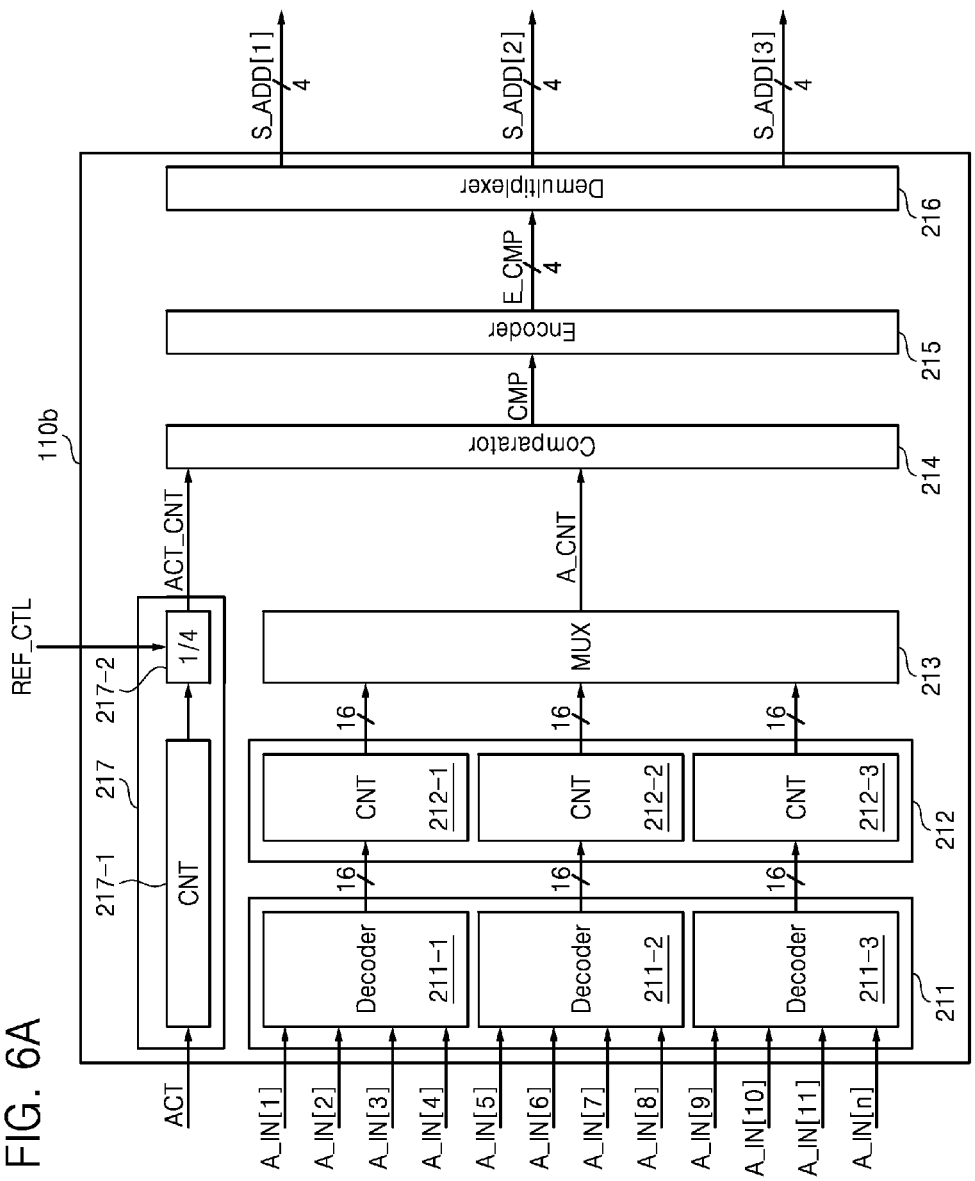

CONCENTRATED ADDRESS DETECTING METHOD OF SEMICONDUCTOR DEVICE AND CONCENTRATED ADDRESS DETECTING CIRCUIT USING THE SAME

CROSS-REFERENCE TO RELATED APPLICATIONS

This application claims the benefit of 35 U.S.C. §119(e) to U.S. Provisional Patent Application 61/740,706 filed on Dec. 21, 2012, the disclosure of which is incorporated herein in its entirety by reference.

BACKGROUND

This disclosure relates to a concentrated address detecting method of a semiconductor device and a concentrated detecting circuit using the same.

A dynamic random access memory (DRAM) is a memory device in which electric charges are stored in a capacitor included in each of a plurality of memory cells. Electric charges stored in the capacitor of each of the plurality of memory cells may be lost due to a leakage current. Thus, the plurality of memory cells should be periodically refreshed to retain data stored therein.

When an address and a command are input to the DRAM, the DRAM may access a memory cell corresponding to the address and perform an operation corresponding to the command on the memory cell. When a specific address is repeatedly input to the DRAM, a specific memory cell (hereinafter referred to as a 'concentrated memory cell') is more frequently accessed than the other memory cells, dynamic noise may increase in neighboring cells of the concentrated memory cell, thereby decreasing cell retention times of the neighboring cells. Thus, the neighboring cells should be more frequently refreshed to retain data stored therein.

SUMMARY

According to an embodiment, there is provided a method of detecting a concentrated address of a semiconductor device using an n-bit address. The method includes dividing the n-bit address into k groups, wherein each of n and k is an integer equal to or greater than 2, for each group of the k groups, detecting one or more concentrated sub addresses corresponding to the group, and generating at least one concentrated address by combining the one or more concentrated sub addresses for the k groups.

Each of the k groups may include an m-bit sub address included in the n-bit address, wherein m is an integer equal to or greater than '1' and less than n.

In this case, k=n, and the k groups may include bits included in the n-bit address, respectively.

The detecting of the one or more concentrated sub addresses may include selecting an m-bit sub address of each of the k groups that is input a number of times that is equal to or greater than a reference value, as the one or more concentrated sub addresses.

The semiconductor device may be a volatile memory, e.g., a dynamic random access memory (DRAM).

The method may further include increasing a frequency of refreshing memory cells corresponding to the one or more concentrated address during a refresh cycle.

The method may further include increasing a frequency of refreshing memory cells adjacent to a memory cell corresponding to the one or more concentrated address during a refresh cycle.

The semiconductor device may be a memory device or a memory controller.

According to another example embodiment, there is provided a concentrated address detecting circuit of a semiconductor device using an n-bit address. The circuit includes a sub concentrated address detector configured to divide the n-bit address into k groups and detect a set of concentrated sub addresses corresponding to each of the k groups, wherein each of n and k is an integer equal to or greater than 2, and a concentrated address detector configured to detect at least one concentrated address by combining the set of concentrated sub addresses for the k groups. The set of concentrated sub addresses includes one or more concentrated sub addresses.

The sub concentrated address detector may include a plurality of counters each configured to count a number of times that each of sub addresses included in each of the k groups is input during a first time period; a multiplexer configured to sequentially output the counted number of times; and a comparator configured to compare each of the outputs of the multiplexer to a reference value.

The sub concentrated address detector may further include a plurality of decoders each configured to receive and decode an m-bit address included in the n-bit address corresponding to one of the k groups (m is an integer that is equal to or greater than '1' and less than n); and an encoder configured to encode each output signal of the comparator and, for each output signal, output a result of encoding the output signal as the set of concentrated sub addresses. Each of the plurality of counters may be configured to receive and count an output signal of the corresponding decoder of the plurality of decoders.

The reference value may be predetermined or changeable in response to a reference value control signal.

The concentrated address detector may include a plurality of registers configured to store the set of concentrated sub addresses corresponding to the k groups, respectively; and a concentrated address selector configured to select and output the set of concentrated sub addresses stored in the plurality of registers as the at least one concentrated addresses.

The semiconductor device may be a dynamic random access memory (DRAM).

The n-bit address may be a row address, a column address, or a combination of the row address and the column address.

The number of the set of concentrated sub addresses corresponding to each of the k groups may be determined based on a cell retention time of the DRAM.

According to still another embodiment, there is provided a method of detecting an address of a memory device, the address used more than a reference number of times during a predetermined time period. The method includes inputting a plurality of addresses each having n bits to j counters during the predetermined time period, wherein n is an integer equal to or greater than 2 and j is less than $2^n$, and for at least one of the addresses, determining that it is input more than the reference number of times during the predetermined time period, using the counters.

BRIEF DESCRIPTION OF THE DRAWINGS

Exemplary embodiments of the disclosure will be more clearly understood from the following detailed description taken in conjunction with the accompanying drawings in which:

FIGS. 6A and 6B are detailed block diagrams of the concentrated address detecting circuit of FIG. 4 according to another embodiment;

DETAILED DESCRIPTION OF THE EMBODIMENTS

Figure 1:
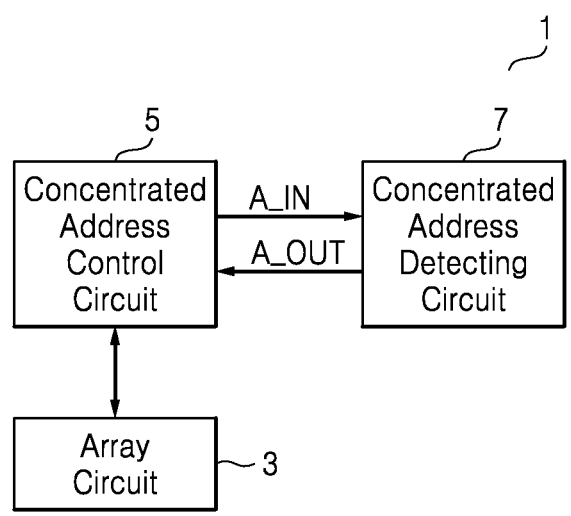
FIG. 1 is a schematic block diagram of a concentrated address control system according to an embodiment.

Various exemplary embodiments will be described more fully with reference to the accompanying drawings, in which exemplary embodiments are shown. The disclosure may, however, be embodied in many different forms and should not be construed as being limited to the embodiments set forth herein. In the drawings, the thicknesses of layers and regions are exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms unless the context indicates otherwise. Unless indicated otherwise, these terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms such as "comprises," "comprising," "includes," and/or "including," when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic block diagram of a concentrated address control system 1 according to an embodiment. Referring to FIG. 1, the concentrated address control system 1 includes an array circuit 3, a concentrated address control circuit 5, and a concentrated address detecting circuit 7.

The array circuit 3 may be a semiconductor circuit that includes one or more semiconductor devices. For example, the array circuit 3 may be embodied as a volatile memory device or a nonvolatile memory device.

The volatile memory device may be embodied, for example, as a dynamic random access memory (DRAM), a static random access memory (SRAM), a thyristor RAM (T-RAM), a zero capacitor RAM (Z-RAM), or a twin transistor RAM (TTRAM).

The nonvolatile memory device may be embodied, for example, as an electrically erasable programmable read-only memory (EEPROM), a flash memory, a magnetic RAM (MRAM), a spin-transfer torque (STT)-MRAM, a conductive bridging RAM (CBRAM), a ferroelectric RAM (FeRAM), a phase change RAM (PRAM), a resistive RAM (RRAM), a nanotube RRAM, a polymer RAM (PoRAM), a nano floating gate memory (nFGm), a holographic memory, a molecular electronics memory device, or an insulator resistance change memory.

The concentrated address control circuit 5 may transmit an address A_IN to the concentrated address detecting circuit 7. The address A_IN may be a signal representing the location of a semiconductor device accessed by the array circuit 3. It will be hereinafter assumed that the address A_IN consists of n bits ('n' denotes an integer that is equal to or greater than '2').

The concentrated address detecting circuit 7 may receive the n-bit address A_IN, detect at least one n-bit concentrated address A_OUT that is more frequently input or accessed than the other addresses, based on the n-bit address A_IN, and then output the at least one n-bit concentrated address A_OUT to the concentrated address control circuit 5. The concentrated address control circuit 5 may control an operation of at least one device (not shown) of the array circuit 3 corresponding to the n-bit concentrated address A_OUT. According to an embodiment, the concentrated address control circuit 5 may further control operations of a plurality of devices adjacent to the at least one device.

Figure 2:
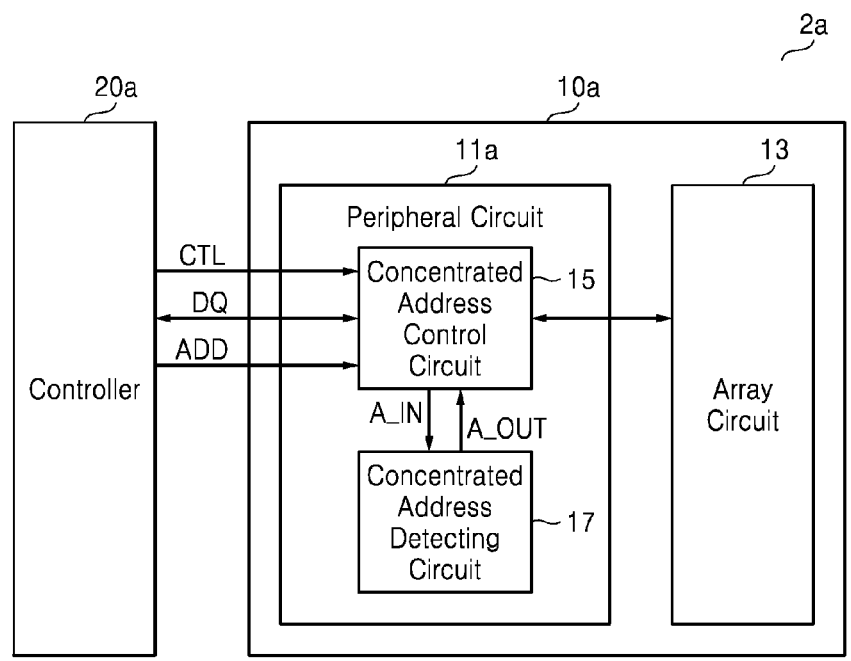
FIG. 2 is a block diagram of a memory system according to an embodiment.

FIG. 2 is a block diagram of a memory system 2a according to an embodiment.

Referring to FIG. 2, the memory system 2a includes a memory controller 20a and a memory device 10a. The memory system 2a may be any of various systems that include a volatile memory or a nonvolatile memory.

The memory controller 20a generates a command signal CTL and an address signal ADD to control an operation of the memory device 10a, e.g., a write/read/refresh operation. The address signal ADD may contain information regarding an n-bit address A_IN.

The memory controller 20a is connected to the memory device 10a via a bus. The memory controller 20a may output the command signal CTL and the address signal ADD to the memory device 10a and exchange input/output data DQ with the memory device 10a, via the bus. The memory device 10a includes an array circuit 13 and a peripheral circuit 11a.

The array circuit 13 may include a plurality of memory cells (not shown).

The peripheral circuit 11a may access the array circuit 13 according to the command signal CTL and the address signal ADD output from the memory controller 20a. The peripheral circuit 11a may include a concentrated address control circuit 15 and a concentrated address detecting circuit 17.

The concentrated address control circuit 15 extracts the n-bit address A_IN from the address signal ADD. The address A_IN may be a row address, a column address, or a combination of the row address and the column address. The concentrated address control circuit 15 may control an operation of the array circuit 13 corresponding to the n-bit address A_IN according to the command signal CTL.

The concentrated address detecting circuit 17 may receive the n-bit address A_IN from the concentrated address control circuit 15, detect at least one n-bit concentrated address A_OUT that is more frequently used (e.g., input or accessed) than the other addresses, based on n-bit address A_IN, and then output the at least one n-bit concentrated address A_OUT to the concentrated address control circuit 15.

The concentrated address control circuit 15 may increase the frequency of refreshing at least one memory cell corresponding to the n-bit concentrated address A_OUT per unit time. The at least one memory cell may be different from the concentrated memory cell, which is directly indicated by the n-bit concentrated address A_OUT. For example, the concentrated address control circuit 15 may increase the frequency of refreshing memory cells adjacent to the concentrated memory cell.

The memory controller 20a and the memory device 10a may be packaged in different packages or in the same package.

Figure 3:
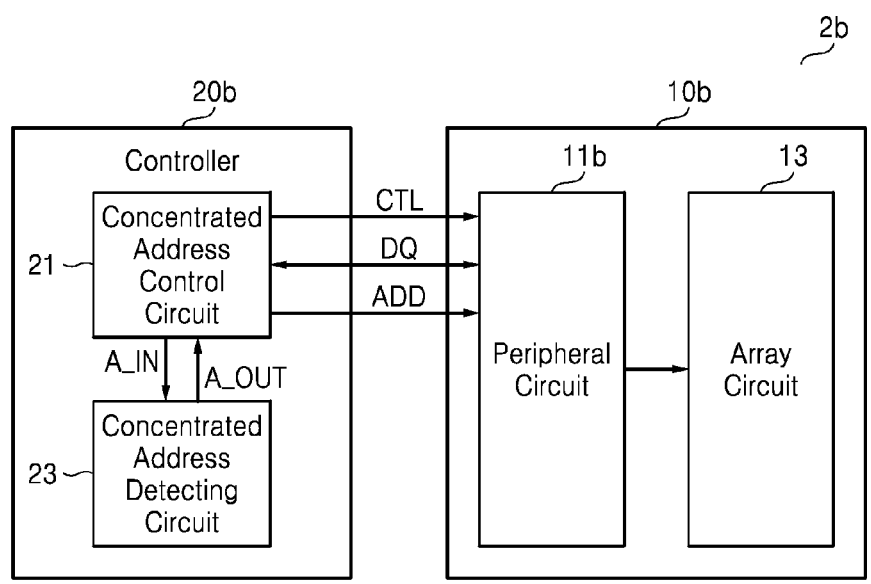
FIG. 3 is a block diagram of a memory system according to another embodiment.

FIG. 3 is a block diagram of a memory system 2b according to another embodiment. The memory system 2b of FIG. 3 is substantially the same as the memory system 2a of FIG. 2 and will thus be described focusing on the differences between the memory systems 2a and 2b below. Referring to FIG. 3, a concentrated address control circuit 21 and a concentrated address detecting circuit 23 may be included in a memory controller 20b other than a peripheral circuit 11b of the a memory device 10b, compared to the memory system 2a of FIG. 2.

The concentrated address control circuit 21 may transmit a command signal CTL and an address signal ADD to the memory device 10b and exchanges input/output data DQ with the memory device 10b.

The address signal ADD may contain information regarding an n-bit address A_IN and an n-bit concentrated address A_OUT.

The peripheral circuit 11b may access an array circuit 13 based on the command signal CTL and the address signal ADD output from the memory controller 20b.

Figure 4:
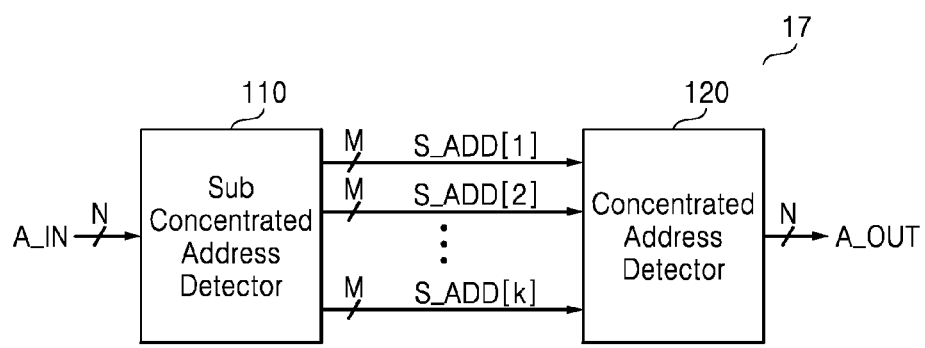
FIG. 4 is a block diagram of a concentrated address detecting circuit of FIG. 2 according to an embodiment.

FIG. 4 is a block diagram of the concentrated address detecting circuit 17 of FIG. 2 according to an embodiment.

Referring to FIG. 4, the concentrated address detecting circuit 17 includes a sub concentrated address detector 110 and a concentrated address detector 120. The sub concentrated address detector 110 divides an n-bit address A_IN into k groups. Here, 'k' denotes an integer that is equal to or greater than '2'.

Bits included in the n-bit address A_IN will be referred to as a first bit to an nth bit, respectively. According to an embodiment, each of the k groups may include m bits among the bits included in the n-bit address A_IN. Here, 'm' denotes an integer that is equal to or greater than '1' and less than 'n'. For example, a first group may include a first bit to an mth bit, and a second group may include an (m+1)th bit to a 2mth bit. For example, n=k×m. A case in which each of the k groups includes m bits will now be described, but the inventive concept is not limited thereto and at least one of the k groups may include a different number of bits according to another embodiment.

An address consisting of the bits of each of the k groups will be referred to as a sub address. A sub address that is more frequently input or accessed than the other sub addresses of the k groups will be referred to as a 'concentrated sub address'.

The sub concentrated address detector 110 detects at least one m-bit concentrated sub address corresponding to each of the k groups, e.g., m-bit concentrated sub addresses S_ADD[1] to S_ADD[k].

The concentrated address detector 120 detects and outputs at least one n-bit concentrated address A_OUT by combining the at least one m-bit concentrated sub address corresponding to each of the k groups, e.g., the m-bit concentrated sub addresses S_ADD[1] to S_ADD[k]. The at least one n-bit concentrated address A_OUT may also comprise some addresses that are not actual concentrated addresses (i.e., one of the concentrated address A_OUT may not be an address that has been input or accessed more than other addresses). However, actual concentrated addresses should be included in the at least one n-bit concentrated address A_OUT, since the more an actual concentrated address is input or accessed, the more concentrated sub addresses of the actual concentrated address are input or accessed. Therefore, dynamic noise may be reduced by increasing a frequency of refreshing memory cells adjacent to a memory cell corresponding to the concentrated addresses A_OUT.

Figure 5:
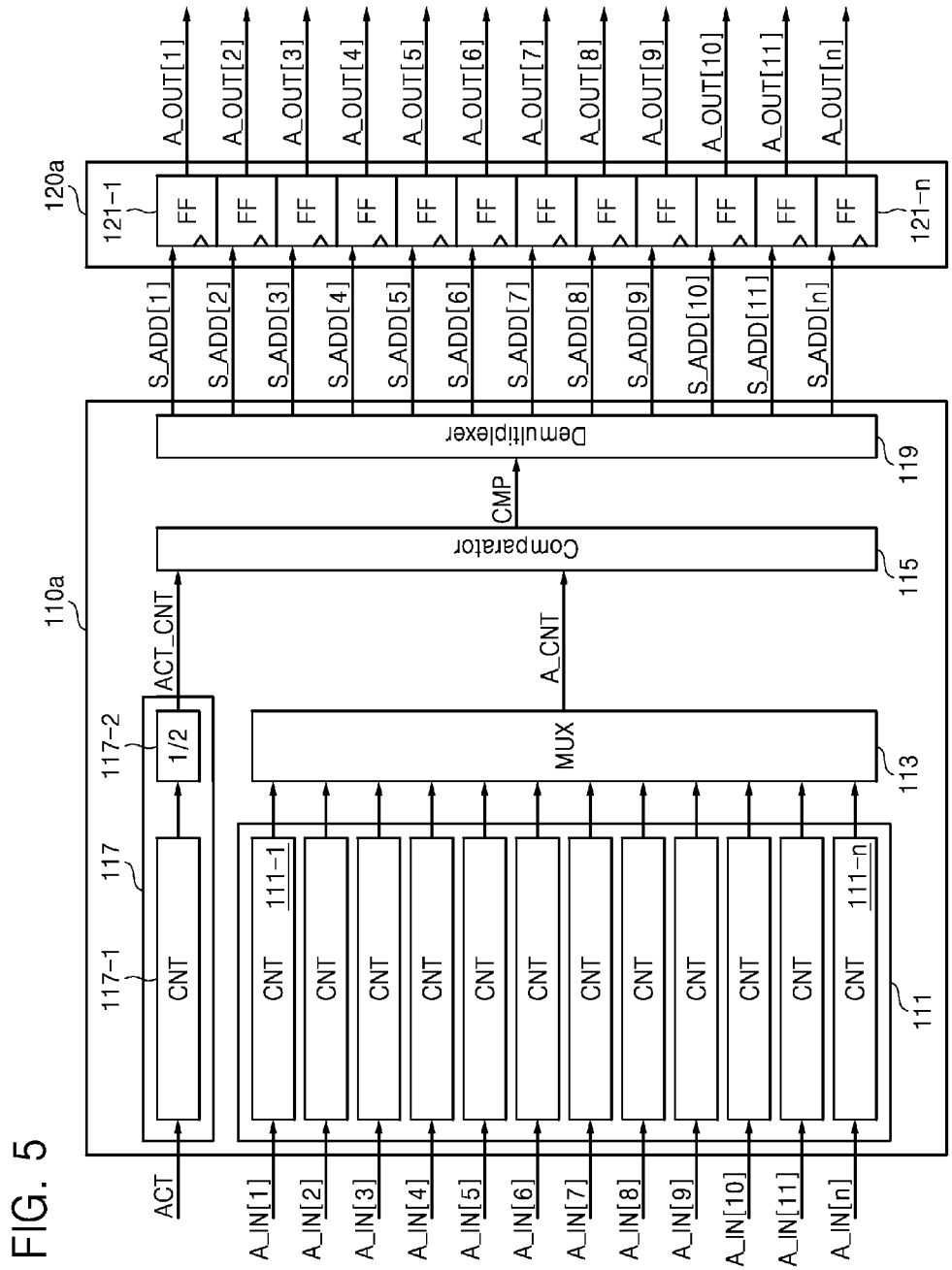
FIG. 5 is a detailed block diagram of the concentrated address detecting circuit of FIG. 4 according to an embodiment.

FIG. 5 is a detailed block diagram of the concentrated address detecting circuit 17 of FIG. 4 according to an embodiment. Referring to FIG. 5, n=12, k=12, and m=1. For example, a sub concentrated address detector 110a may divide a 12-bit address A_IN into twelve groups A_IN[1] to A_IN[n], and detect concentrated sub addresses S_ADD[1] to S_ADD[n] corresponding to the respective twelve groups A_IN[1] to A_IN[n]. A case in which n=12, i.e., a 12-bit address is used will now be described but the inventive concept is not limited thereto.

The sub concentrated address detector 110a may include a plurality of counters 111 (or, a counter unit), a multiplexer 113, a comparator 115, a reference value generating circuit 117, and a demultiplexer 119.

In the counter unit 111, each of a plurality of counters 111-1 to 111-n counts a number of times that a sub address '0' or '1' of the corresponding group among the twelve groups A_IN[1] to A_IN[n] is input. For example, the first counter 111-1 may count a number of times that the first bit A_IN[1] has a particular value, for example, '1' whenever the 12-bit address A_IN is input.

The multiplexer 113 receives outputs of the plurality of respective counters 111-1 to 111-n and outputs an address count signal A_CNT. The address count signal A_CNT may be a result of sequentially outputting the outputs of the plurality of counters 111-1 to 111-n. The comparator 115 may compare a value of the address count signal A_CNT to a reference value ACT_CNT, and may sequentially output a result of the comparing.

The reference value generating circuit 117 generates the reference value ACT_CNT. According to an embodiment, the reference value generating circuit 117 may include an address input counter 117-1 and a division arithmetic unit 117-2.

The address input counter 117-1 counts an address input signal ACT that is activated whenever each n-bit address is input.

The division arithmetic unit 117-2 may divide a result of counting the address input signal ACT by the address input counter 117-1 by, for example, 2, and set and output a result of the dividing as the reference value ACT_CNT.

According to another embodiment, the reference value ACT_CNT may be a predetermined value. For example, the reference value ACT_CNT may be a value stored in a register (not shown).

For example, when a number of times that '1' is input is greater than the reference value ACT_CNT that is half a number of times an address is input with respect to each of bits of the n-bit address A_IN, i.e., when '1' is more frequently input than '0', the comparator 115 may output '1'. The comparator 115 may output '0' when '0' is more frequently input than '1' with respect to each of the bits of the n-bit address A_IN, and may output '1' or '0' when '1' and '0' are input the same number of times.

The demultiplexer 119 demultiplexes an output signal CMP of the comparator 115, and outputs the concentrated sub addresses S_ADD[1] to S_ADD[n] corresponding to the twelve groups A_IN[1] to A_IN[n]. For example, for the A_IN[1] of the n-bit address A_IN, when a number of '1' is input equal to or more than the reference value ACT_CNT during a predetermined time period the concentrated sub address S_ADD[1] indicates '1'.

The concentrated address detector 120a may include a plurality of registers 121-1 to 121-n. The plurality of registers 121-1 to 121-n may be, for example, flip-flops and may correspond to bits of an n-bit concentrated address A_OUT, respectively.

The plurality of registers 121-1 to 121-n may sequentially receive and store the concentrated sub addresses S_ADD[1] to S_ADD[n] output from the demultiplexer 119, respectively. The plurality of registers 121-1 to 121-n may simultaneously output the concentrated sub addresses S_ADD[1] to S_ADD[n] stored therein as n-bit concentrated addresses A_OUT[1]) to A_OUT[n].

According to another embodiment, the output signal CMP of the comparator 115 may be supplied to n flip-flops connected in series without using the demultiplexer 119. For example, when the results of comparing the bits of the n-bit address A_IN to the reference value ACT_CNT are completely stored in the n flip-flops, respectively, outputs of the n flip-flops may be output as the n-bit concentrated addresses A_OUT[1]) to A_OUT[n].

Figure 6B:
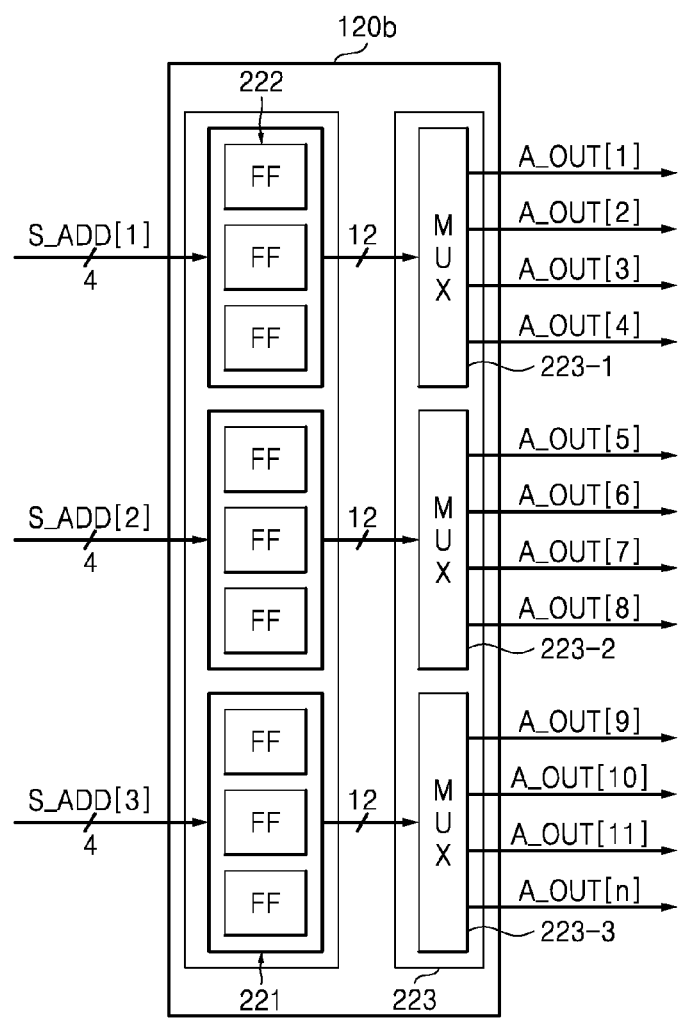

FIGS. 6A and 6B are detailed block diagrams of the concentrated address detecting circuit 17 of FIG. 4 according to another embodiment. The concentrated address detecting circuit 17 of FIG. 4 may include a sub concentrated address detector 110b of FIG. 6A, and a concentrated address detector 120b of FIG. 6B.

Referring to FIG. 6A, for example, n=12, k=3, and m=4. In other words, the sub concentrated address detector 110b divides a 12-bit address A_IN into three groups, and detects one or more concentrated sub addresses of each of the three groups, e.g., concentrated sub addresses S_ADD[1], S_ADD[2], and S_ADD[3]. However, the inventive concept is not limited thereto.

The sub concentrated address detector 110b may include a decoder unit 211, a counter unit 212, a multiplexer 213, a comparator 214, an encoder 215, a demultiplexer 216, and a reference value generating circuit 217.

In the decoder unit 211, each of a plurality of decoders 211-1 to 211-3 receives and decodes each m-bit address included in an n-bit address A_IN. For example, since m=4, a first group includes a first bit A_IN[1] to a fourth bit A_IN[4] included in the n-bit address A_IN.

The first decoder 211-1 receives the first bit A_IN[1] to the fourth bit A_IN[4] included in the n-bit address A_IN, and outputs a 16-bit decoding signal corresponding to the first group, i.e., '0000' to '1111'.

In counter unit 212, each of a plurality of counters 212-1 to 212-3 counts a number of times that sub addresses included in the corresponding group among the three groups is input during a first time period. For example, the first counter group 212-1 may include sixteen counter circuits (not shown), since the number of sub addresses '0000' to '1111' that the first bit A_IN[1] to the fourth bit A_IN[4] in the n-bit address A_IN may have is sixteen.

The number of counter circuits may be equal to the number of sub addresses, that is, may be $2^m \times k$. Since k=3 and m=4, the number of counter circuits may be 48.

The multiplexer 213 receives outputs of the plurality of respective counters 212-1 to 212-3 and outputs an address count signal A_CNT. The address count signal A_CNT may be a result of sequentially outputting the outputs of the plurality of respective counters 212-1 to 212-3.

The comparator 214 may compare the address count signal A_CNT to a reference value ACT_CNT, and output a result of the comparing. The comparator 214 outputs '1' when a value of the address count signal A_CNT is equal to or greater than the reference value ACT_CNT and outputs '0' when the value of the address count signal A_CNT is less than the reference value ACT_CNT, thereby enabling to select a concentrated sub address of each of the groups that is input a number of times that is equal to or greater than the reference value ACT_CNT. However, the inventive concept is not limited thereto.

The reference value generating circuit 217 generates the reference value ACT_CNT.

In one embodiment, the reference value ACT_CNT may be a predetermined value. For example, the reference value ACT_CNT may be a value stored in a register (not shown).

In one embodiment, the reference value ACT_CNT may vary according to a reference value control signal REF_CTL. For example, the reference value generating circuit 217 may include an address input counter 217-1 and a division arithmetic unit 217-2.

The address input counter 217-1 may count an address activation signal ACT that is activated whenever the n-bit address A_IN is input.

The division arithmetic unit 217-2 may divide a result of counting the address activation signal by the address input counter 217-1 by a predetermined integer, e.g., '4', and set a result of the dividing as the reference value ACT_CNT. The predetermined integer may vary according to a reference value control signal REF_CTL input from the outside the memory device.

An output signal CMP of the comparator 214 may be a result of sequentially outputting comparison results corresponding to respective sub addresses. For example, the output signal CMP of the comparator 214 may be a signal that is maintained at a first logic level in a first time period corresponding to a concentrated sub address and that is maintained at a second logic level in a second time period. The encoder 215 encodes the output signal CMP of the comparator 214 and generates a 4-bit encoding signal E_CMP. The 4-bit encoding signal E_CMP may be a result of sequentially outputting the concentrated sub addresses S_ADD[1], S_ADD[2], and S_ADD[3] of the respective groups.

In one embodiment, each of the groups may generate 3 sub addresses resulting from the comparison and encoding. For example, the concentrated sub address S_ADD[1] may include 3 sub addresses. At least each of the 3 sub addresses may input equal to or greater than the reference value ACT_CNT during a predetermined time period.

The demultiplexer 216 demultiplexes the 4-bit encoding signal E_CMP into the concentrated sub addresses S_ADD [1], S_ADD[2], and S_ADD[3] of the respective groups, and outputs the concentrated sub addresses S_ADD[1], S_ADD [2], and S_ADD[3].

Referring to FIG. 6B, the concentrated address detector 120b may include a plurality of register groups 221 and a concentrated address selector 223.

The plurality of register groups 221 may be disposed to correspond to the groups, respectively, and may each store concentrated sub addresses S_ADD that correspond to the respective groups and the number of which is equal to or greater than '1' and less than or equal to p. Here, 'p' denotes an integer that is equal to or greater than '1'.

For example, p=3, the plurality of register groups 221 may each includes three flip-flop groups 222, and the three flip-flop groups 222 may each store one 4-bit concentrated sub address S_ADD. Thus, a maximum number of 4-bit concentrated sub addresses S_ADD that each of the plurality of register groups 221 may store is three. However, the plurality of register groups 221 may each store 4-bit concentrated sub addresses S_ADD, the number of which is less than p, based on a comparison result of the comparator 214 of FIG. 6A.

A maximum number p of concentrated sub addresses S_ADD of each of the groups that may be stored may vary according to the reference value ACT_CNT of FIG. 6A. When a memory device is a DRAM, the maximum number p of concentrated sub addresses S_ADD of each of the groups that may be stored may be set according to a cell retention time. For example, when the cell retention time is short, the maximum number p may be increased to generate more concentrated addresses.

Each of the three flip-flop groups 222 may simultaneously output 4-bit concentrated sub addresses S_ADD, respectively. Thus, each of the plurality of register groups 221 may simultaneously output 12 bits.

The concentrated address selector 223 may be embodied as a multiplexer including a plurality of sub concentrated address selectors, and each of the plurality of sub concentrated address selectors may select and output 4-bit concentrated sub addresses S_ADD corresponding to each of the plurality of flip-flop groups 222.

For example, when concentrated sub addresses S_ADD[1] corresponding to the first bit A_IN[1] to the fourth bit A_IN[4] of the n-bit address A_IN are '0001', '0101, and '1011', the first flip-flop group 222 may output 12 bits '0001 0101 1011' by simultaneously outputting the three concentrated sub addresses S_ADD[1]. A first concentrated sub address selector 223-1 may receive bits output from the first flip-flop group 222, selects one of '0001', '0101', and '1011', and output the selected bits as the first bit A_OUT[1] to the fourth bit A_OUT[4] of the concentrated address A_OUT.

Three 4-bit concentrated sub addresses S_ADD selected by the sub concentrated address selectors 223-1, 223-2, and 223-3 may constitute a 12-bit concentrated address A_OUT. Since each of the plurality of register groups 221 may output three concentrated sub addresses S_ADD and the number of the plurality of register groups 221 is three, the number of concentrated addresses A_OUT that may be generated may be $3^3$ (=27).

In general, when 12-bit addresses are decoded and a number of times that each of these addresses is input are counted to detect a concentrated address among the 12-bit addresses, $2^{12}$(=4096) counters are needed.

According to the embodiment of FIG. 5, a 12-bit address is divided into twelve groups. When a 12-bit concentrated address is most often input, twelve concentrated sub addresses that constitute the 12-bit concentrated address are also most often input among the twelve groups.

Thus, a concentrated address may be detected using only twelve counters by detecting and combining concentrated sub addresses for respective groups.

According to the embodiment of FIGS. 6A and 6B, a 12-bit address is first divided into three groups. When a 12-bit concentrated address is most often input, three 4-bit concentrated sub addresses that constitute the 12-bit concentrated address are most often input among the three groups.

Thus, a concentrated address may be detected using only $2^4 \times 3$ (=48) counters by detecting and combining the 4-bit concentrated sub addresses.

Accordingly, costs of manufacturing the concentrated address detecting circuit 17 may be saved, and a semiconductor device corresponding to the concentrated address may be effectively controlled.

Figure 7:
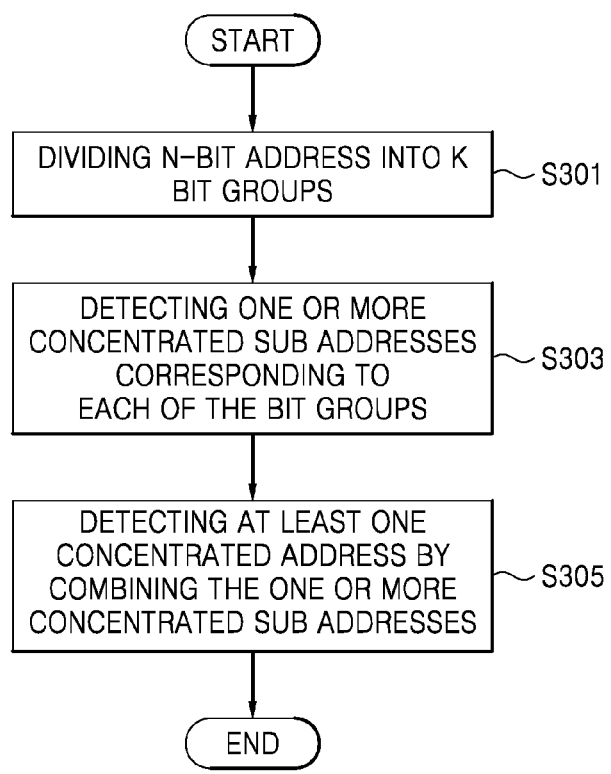
FIG. 7 is a flowchart illustrating a method of detecting a concentrated address according to an embodiment.

FIG. 7 is a flowchart illustrating a method of detecting a concentrated address according to an embodiment.

Referring to FIGS. 4 and 7, the sub concentrated address detector 110 divides an n-bit address A_IN into k groups (operation S301). Here, 'k' denotes an integer that is equal to or greater than '2'.

Then, the sub concentrated address detector 110 detects one or more concentrated sub addresses S_ADD corresponding to each of the k groups (operation S303).

Then, the concentrated address detector 120 detects at least one concentrated address A_OUT by combining the one or more concentrated sub address S_ADD corresponding to each of the k groups (operation S305).

Figure 8:
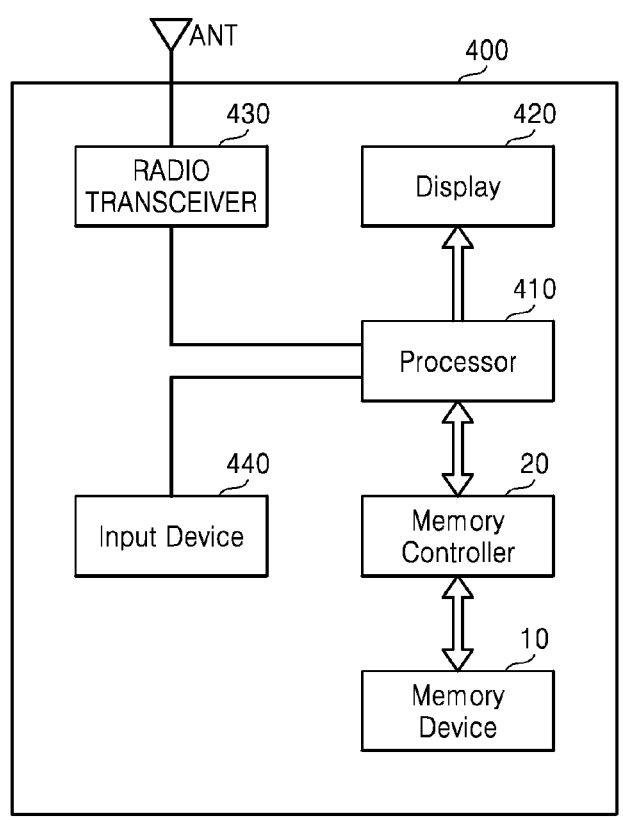
FIG. 8 is an exemplary block diagram of a memory system according to an embodiment.

FIG. 8 is an exemplary block diagram of a memory system 400 according to an embodiment.

Referring to FIG. 8, the memory system 400 may be embodied, for example, as a cellular phone, a smart phone, a personal digital assistant (PDA), or a wireless communication device.

The memory system 400 may include a memory device 10 and a memory controller 20 as illustrated in FIG. 2 or 3. The memory controller 20 may control a data access operation of the memory device 10 under control of a processor 410.

Data programmed in the memory device 10 may be displayed on a display unit 420, under control of the processor 410 and/or the memory controller 20.

A radio transceiver 430 may receive or transmit a radio signal via an antenna AnT. For example, the radio transceiver 430 may transform a radio signal received via the antenna AnT into a signal to be processed by the processor 410.

Thus, the processor 410 may process a signal received from the radio transceiver 430 and transmit the processed signal to the memory controller 20 or the display unit 420. The memory controller 20 may write the signal processed by the processor 410 to the memory device 10.

Also, the radio transceiver 430 may transform a signal output from the processor 410 into a radio signal and output the radio signal to an external device (not shown) via the antenna AnT.

An input device 440 is a device via which a control signal for controlling an operation of the processor 410 or data that is to be processed by the processor 410 is input, and may be embodied as a pointing device such as a touch pad and a computer mouse, a keypad, or a keyboard.

The processor 410 may control an operation of the display unit 420 to display data output from the memory controller 20, the radio transceiver 430, or the input device 440 on the display unit 420.

Figure 9:
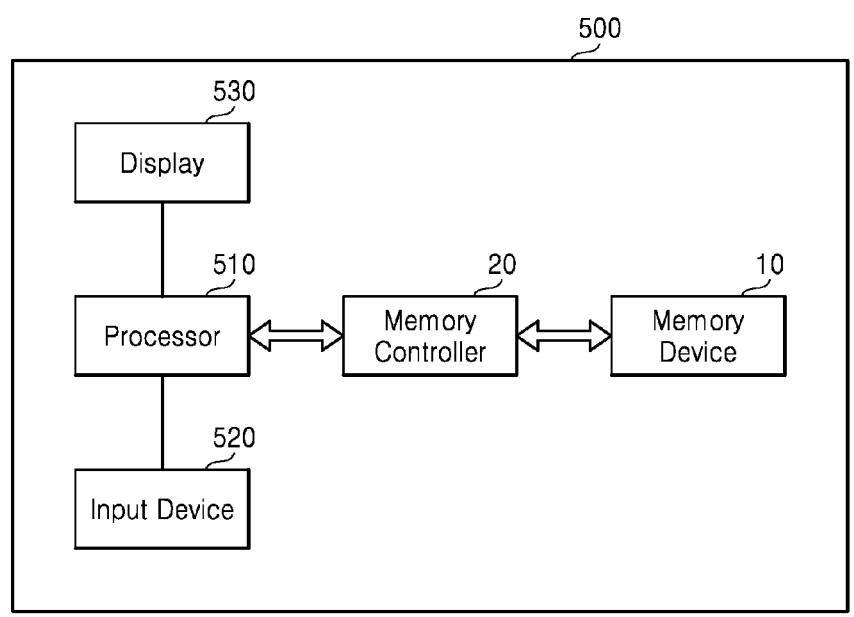
FIG. 9 is an exemplary block diagram of a memory system according to another embodiment.

FIG. 9 is an exemplary block diagram of a memory system 500 according to another embodiment. The memory system 500 may be implemented, for example, as a personal computer (PC), a tablet PC, a net-book, an e-reader, a personal digital assistant (PDA), a portable multimedia player (PMP), an MP3 player, or an MP4 player.

The memory system 500 may include the memory device 10 and the memory controller 20 as illustrated in FIG. 2 or FIG. 3.

A processor 510 may display data stored in the memory device 10 through a display 230 according to data input through an input device 520. The input device 520 may be implemented by a pointing device such as a touch pad or a computer mouse, a keypad, or a keyboard.

The processor 510 may control the overall operation of the memory system 500 and the operations of the memory controller 20. The memory controller 20, which may control the operations of the memory device 10, may be implemented as a part of the processor 510 or as a separate chip.

Figure 10:
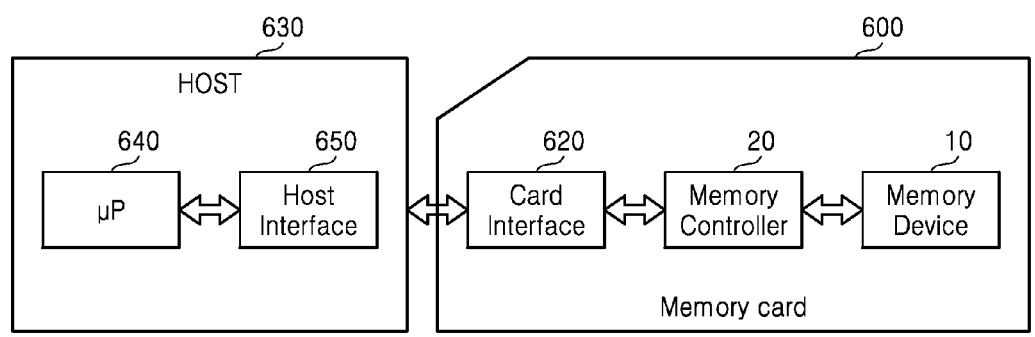
FIG. 10 is an exemplary block diagram of a memory system according to further another embodiment.

FIG. 10 is an exemplary block diagram of a memory system 600 according to further another embodiment. The memory system 600 may be implemented, for example, as a memory card or a smart card. The memory system 600 may include the memory device 10 and the memory controller 20 as illustrated in FIG. 2 or FIG. 3, and a card interface 620.

The memory controller 610 may control data exchange between the memory device 10 and the card interface 620. The card interface 620 may be a secure digital (SD) card interface or a multi-media card (MMC) interface, but the inventive concept is not restricted to the current embodiments.

The card interface 620 may interface a host 630 and the memory controller 610 for data exchange according to a protocol of the host 630. The card interface 620 may support a universal serial bus (USB) protocol and an interchip (IC)-USB protocol. Here, the card interface 620 may indicate a hardware supporting a protocol used by the host 630, a software installed in the hardware, or a signal transmission mode.

In one embodiment, when the memory system 600 is connected with the host 630 such as a PC, a tablet PC, a digital camera, a digital audio player, a cellular phone, a console video game hardware, or a digital set-top box, a host interface 650 may perform data communication with the memory device 10 through the card interface 620 and the memory controller 610 according to the control of a microprocessor 640.

Figure 11:
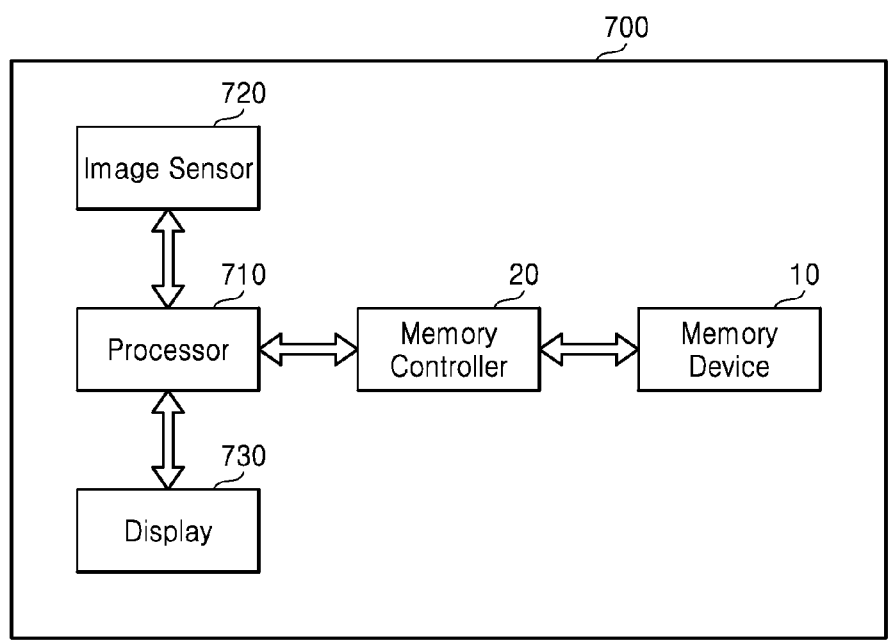
FIG. 11 is an exemplary block diagram of a memory system according to still another embodiment.

FIG. 11 is an exemplary block diagram of a memory system 700 according to still another embodiment. The memory system 700 may be implemented, for example, as an image processor like a digital camera, a cellular phone equipped with a digital camera, a smart phone equipped with a digital camera, or a tablet PC equipped with a digital camera.

The memory system 700 may include the memory device 10 and the memory controller 20 as illustrated in FIG. 2 or FIG. 3. An image sensor 720 included in the memory system 700 converts optical images into digital signals and outputs the digital signals to a processor 710 or the memory controller 20. The digital signals may be controlled by the processor 710 to be displayed through a display 730 or stored in the memory device 10 through the memory controller 20.

Data stored in the memory device 10 may be displayed through the display 730 according to the control of the processor 710 or the memory controller 20. The memory controller 20, which may control the operations of the memory device 10, may be implemented as a part of the processor 710 or as a separate chip.

Figure 12:
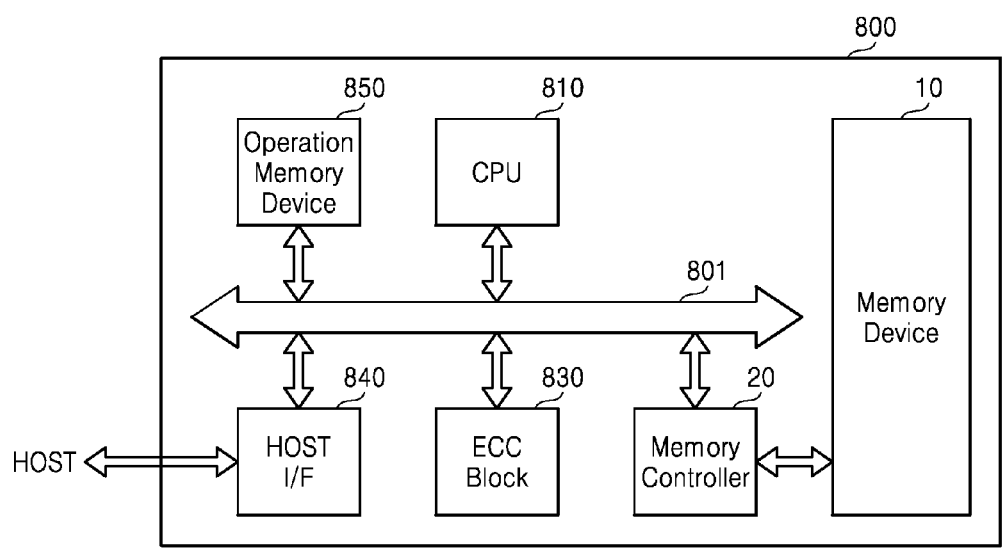
FIG. 12 is an exemplary block diagram of a memory system according to still another embodiment.

FIG. 12 is an exemplary block diagram of a memory system 800 according to still another embodiment. The memory system 800 may include the memory device 10 and the memory controller 20 as illustrated in FIG. 2 or FIG. 3.

The memory system 800 may be implemented, for example, as a flash memory drive, a USB memory drive, an IC-USB memory drive, or a memory stick.

The memory system 800 may include a central processing unit (CPU) 810 controlling the memory device 10 and an operation memory device 550 that may be used an operation memory of the CPU 810. The operation memory device 850 may be implemented by a non-volatile memory like read-only memory (ROM) or a volatile memory like static random access memory (SRAM). A host connected with the memory system 800 may perform data communication with the memory device 10 through the memory controller 20 and a host interface 840.

An error correction code (ECC) block 830 is controlled by the CPU 810 to detect an error bit included in data output from the memory device 10 through the memory controller 20, correct the error bit, and transmit the error-corrected data to the host through the host interface 840. The CPU 810 may control data communication among the memory controller 20, the ECC block 830, the host interface 840, and the operation memory device 850 through a bus 801.

Figure 13:
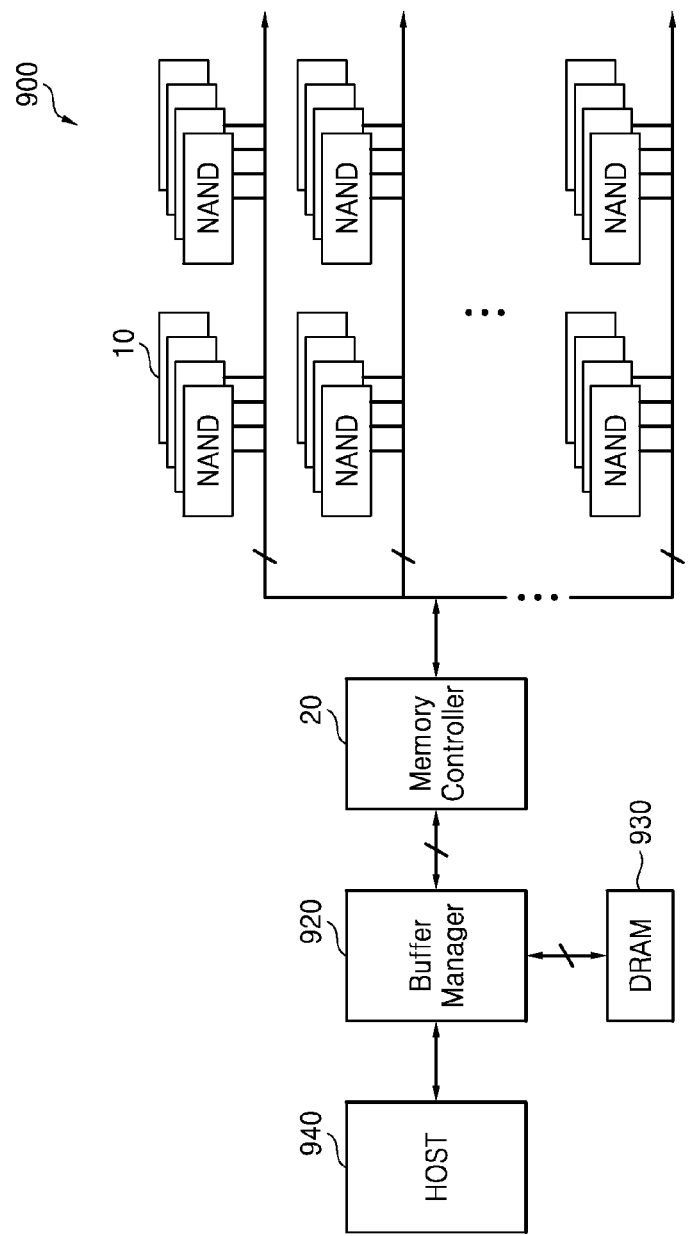
FIG. 13 is an exemplary block diagram of a memory system according to still another embodiment.

FIG. 13 is an exemplary block diagram of a memory system 900 according to still another embodiment. The memory system 900 may be implemented as a data storage system like a solid state drive (SSD).

The memory system 900 includes the memory device 10 and the memory controller 20 as illustrated in FIG. 2 or FIG. 3. A plurality of memory devices 10 may be included in the memory system 900. For example, each of the memory devices 10 may include a non-volatile memory device like NAND flash memory.

The memory system 900 may further include a volatile memory device 930 like a dynamic random access memory (DRAM), and a buffer manager 920 controlling data transferred between the memory controller 910 and a host 940 to be stored in the volatile memory device 930.

Figure 14:
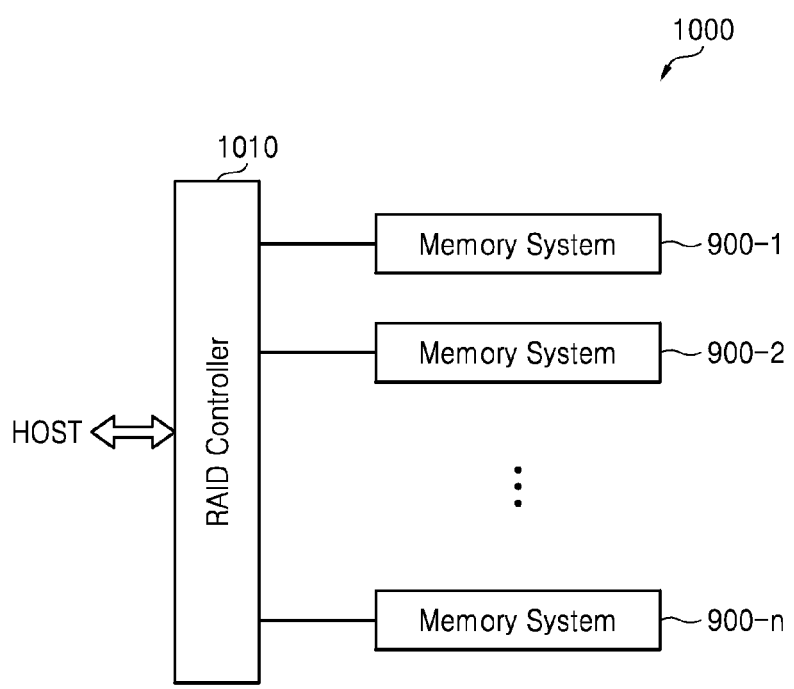
FIG. 14 is an exemplary block diagram of a data processing apparatus including the memory system illustrated in FIG. 13 according to an embodiment.

FIG. 14 is an exemplary block diagram of a data processing apparatus including the memory system 900 illustrated in FIG. 13 according to an embodiment. Referring to FIGS. 13 and 14, the data processing apparatus 1000 may be implemented, for example, as a redundant array of independent disks (RAID) system. The data processing apparatus 1000 includes a RAID controller 1010 and a plurality of memory systems 900-1 through 900-n where "n" is a natural number.

Each of the memory systems 900-1 through 900-n may be the memory system 900 illustrated in FIG. 13. The memory systems 900-1 through 900-n may form a RAID array. The data processing apparatus 1000 may be a PC or an SSD.

During a program operation, the RAID controller 1010 may transmit program data output from a host to at least one of the memory systems 900-1 through 900-n according to a RAID level in response to a program command received from the host. During a read operation, the RAID controller 1010 may transmit to the host data read from at least one of the memory systems 900-1 through 900-n in response to a read command received from the host.

The present disclosure can also be embodied as computer-readable codes on a computer-readable medium. The computer-readable recording medium is any data storage device that can store data as a program which can be thereafter read by a computer system. Examples of the computer-readable recording medium include, for example, a read-only memory (ROM), a random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish the present disclosure can be easily construed by programmers.

According to an embodiment, the memory controller 20 capable of controlling an operation of the memory device 10 may be embodied as a part of the processor 710 or a chip installed separately from the processor 710.

According to the disclosed embodiments, concentrated sub addresses are detected and combined to detect a concentrated address. Accordingly, a semiconductor device corresponding to the concentrated address may be effectively controlled, and the size and manufacturing costs of a concentrated address detecting circuit may be reduced.

While the disclosure has been particularly shown and described with reference to exemplary embodiments thereof, it will be understood that various changes in form and details may be made therein without departing from the spirit and scope of the following claims.

What is claimed is:

1. A method of detecting a concentrated address of a semiconductor device using an n-bit address, the method comprising:
   dividing the n-bit address into k groups of m bits each, and separately decoding the m bits of each of the k groups to provide $2^m$ decoding signals for each of the k groups, wherein each of m, n and k is an integer equal to or greater than 2 and n equals k×m;
   counting each of the $2^m$ decoding signals for each of the k groups to provide a corresponding count representing a number of times that m-bit sub address of the n-bit address is input during a predetermined time period;
   for each group of the k groups, detecting one or more concentrated m-bit sub addresses corresponding to the group in response to the counting; and
   generating at least one n-bit concentrated address by combining the one or more concentrated m-bit sub addresses.

2. The method of claim 1, wherein k=n, and
   wherein the k groups comprise bits included in the n-bit address, respectively.

3. The method of claim 1, wherein the detecting of the one or more concentrated m-bit sub addresses comprises:
   selecting an m-bit sub address of each of the k groups that is input a number of times that is equal to or greater than a reference value, as the one or more concentrated m-bit sub addresses.

4. The method of claim 1, further comprising:
   increasing a frequency of refreshing memory cells corresponding to the one or more concentrated m-bit sub addresses during a refresh cycle,
   wherein the semiconductor device is a dynamic random access memory (DRAM).

5. The method of claim 1, further comprising:
   increasing a frequency of refreshing memory cells adjacent to a memory cell corresponding to the one or more concentrated m-bit sub addresses during a refresh cycle,
   wherein the semiconductor device is a dynamic random access memory (DRAM).

6. The method of claim 1, wherein the semiconductor device is a memory device or a memory controller.

7. A concentrated address detecting circuit of a semiconductor device using an n-bit address, the circuit comprising:
   a sub concentrated address detector configured to divide the n-bit address into k groups and detect one or more concentrated sub addresses for each of the k groups, wherein each of n and k is an integer equal to or greater than 2; and
   a concentrated address detector configured to detect at least one concentrated address by combining the one or more concentrated sub addresses of the k groups,
   wherein the concentrated address detector comprises:
      for each of the k groups, a plurality of registers configured to store the one or more concentrated sub addresses corresponding to the k groups, respectively; and
      a concentrated address selector configured to combine and output the one or more concentrated sub addresses stored in the plurality of registers as the at least one concentrated address.

8. The circuit of claim 7, wherein the sub concentrated address detector comprises:
   a plurality of counters each configured to count a number of times that each of sub addresses included in each of the k groups is input during a first time period;
   a multiplexer configured to sequentially output the counted number of times; and
   a comparator configured to compare each of the outputs of the multiplexer to a reference value.

9. The circuit of claim 8, wherein the sub concentrated address detector further comprises:
   a plurality of decoders each configured to receive and decode an m-bit address included in the n-bit address corresponding to one of the k groups, wherein m is an integer equal to or greater than 1 and less than n; and
   an encoder configured to encode each output signal of the comparator and, for each output signal, output a result of encoding the output signal as the set of concentrated sub addresses,
   wherein each of the plurality of counters is configured to receive and count an output signal of the corresponding decoder of the plurality of decoders.

10. The circuit of claim 8, wherein the reference value is predetermined or changeable in response to a reference value control signal.

11. The circuit of claim 7, wherein the concentrated address detector comprises:
   a plurality of registers configured to store and output each bit of the set of concentrated sub addresses as the at least one concentrated address.

12. The circuit of claim 7, wherein the semiconductor device is a dynamic random access memory (DRAM), and
   wherein the n-bit address is a row address, a column address, or a combination of the row address and the column address.

13. The circuit of claim 7, wherein the semiconductor device is a dynamic random access memory (DRAM), and
   wherein the number of the set of concentrated sub addresses corresponding to each of the k groups is determined based on a cell retention time of the DRAM.

14. A method of detecting an address of a memory device, the address used more than a reference number of times during a predetermined time period, the method comprising:

inputting a plurality of addresses each having n bits to j counters during the predetermined time period, wherein n is an integer equal to or greater than 2 and j is less than $2^n$;

for at least one of the addresses, determining that it is input more than the reference number of times during the predetermined time period, using the counters;

dividing the n-bit address into k groups and decoding an m-bit address of each of the k groups;

for $2^m$ decoding signals of each of the k groups, counting a number of times that m-bit address corresponding to the $2^m$ decoding signals is input during the predetermined time period;

for each of $2^m$ decoding signals, comparing the counted number of times to the reference number; and detecting the at least one of the addresses based on a result of the comparison, wherein k is an integer equal to or greater than 2 and m is less than n.

15. The method of claim 14, wherein the reference number of times is at least p/4 when p addresses are input during the predetermined time period, wherein p is an integer equal to or greater than 4.

16. The method of claim 14, wherein j is equal to or greater than n, and less than 4n+1.

17. A concentrated address detecting circuit of a semiconductor device using an n-bit address, the circuit comprising:

a sub concentrated address detector configured to divide the n-bit address into k groups and detect one or more concentrated sub addresses for each of the k groups, wherein each of n and k is an integer equal to or greater than 2; and a concentrated address detector configured to detect at least one concentrated address by combining the one or more concentrated sub addresses of the k groups, wherein the sub concentrated address detector comprises:

a plurality of counters each configured to count a number of times that each of sub addresses included in each of the k groups is input during a first time period;

a multiplexer configured to sequentially output the counted number of times; and a comparator configured to compare each of the outputs of the multiplexer to a reference value.

18. The circuit of claim 17, wherein the sub concentrated address detector further comprises:

a plurality of decoders each configured to receive and decode an m-bit address included in the n-bit address corresponding to one of the k groups, wherein m is an integer equal to or greater than 1 and less than n; and an encoder configured to encode each output signal of the comparator and, for each output signal, output a result of encoding the output signal as the set of concentrated sub addresses, wherein each of the plurality of counters is configured to receive and count an output signal of the corresponding decoder of the plurality of decoders.

19. The circuit of claim 17, wherein the reference value is predetermined or changeable in response to a reference value control signal.

20. The circuit of claim 17, wherein the concentrated address detector comprises:

for each of the k groups, a plurality of registers configured to store the one or more concentrated sub addresses corresponding to the k groups, respectively; and a concentrated address selector configured to combine and output the one or more concentrated sub addresses stored in the plurality of registers as the at least one concentrated address.

21. The circuit of claim 17, wherein the semiconductor device is a dynamic random access memory (DRAM), and wherein the n-bit address is a row address, a column address, or a combination of the row address and the column address.

22. The circuit of claim 17, wherein the semiconductor device is a dynamic random access memory (DRAM), and wherein the number of the set of concentrated sub addresses corresponding to each of the k groups is determined based on a cell retention time of the DRAM.

* * * * *